United States Patent
Sato

(10) Patent No.: US 10,686,089 B2
(45) Date of Patent: Jun. 16, 2020

(54) CONCENTRATOR PHOTOVOLTAIC CELL

(71) Applicant: RICOH COMPANY, LTD., Tokyo (JP)

(72) Inventor: Shunichi Sato, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 366 days.

(21) Appl. No.: 14/945,664

(22) Filed: Nov. 19, 2015

(65) Prior Publication Data

US 2016/0149066 A1 May 26, 2016

(30) Foreign Application Priority Data

Nov. 25, 2014 (JP) .................................. 2014-237380

(51) Int. Cl.
| | | |
|---|---|---|
| *H01L 31/054* | (2014.01) | |
| *H01L 31/02* | (2006.01) | |
| *H01L 31/0304* | (2006.01) | |
| *H01L 31/075* | (2012.01) | |

(Continued)

(52) U.S. Cl.
CPC .... *H01L 31/0543* (2014.12); *H01L 31/02021* (2013.01); *H01L 31/0312* (2013.01); *H01L 31/03048* (2013.01); *H01L 31/0547* (2014.12); *H01L 31/0687* (2013.01); *H01L 31/075* (2013.01); *Y02E 10/52* (2013.01); *Y02E 10/544* (2013.01); *Y02E 10/548* (2013.01)

(58) Field of Classification Search
CPC .......... H01L 31/0543; H01L 31/03762; H01L 31/0304; H01L 31/0687; H01L 31/0725; Y02E 10/50

USPC ................................. 136/243–265, 255–256
See application file for complete search history.

(56) References Cited

U.S. PATENT DOCUMENTS 4,053,327 A * 10/1977 Meulenberg, Jr. .......................... H01L 31/0543
136/256
4,332,974 A * 6/1982 Fraas .................. H01L 31/0687
136/249

(Continued)

FOREIGN PATENT DOCUMENTS

| JP | 11-214726 | 6/1999 |
|---|---|---|
| JP | 2000-156518 | 6/2000 |

(Continued)

OTHER PUBLICATIONS

Masafumi Yamaguchi et al., "Super high-efficiency multi-junction and concentrator solar cells", Solar Energy Materials & Solar Cells 90 (2008) pp. 3068-3077.

(Continued)

*Primary Examiner* — Niki Bakhtiari
(74) *Attorney, Agent, or Firm* — Oblon, McClelland, Maier & Neustadt, L.L.P.

(57) ABSTRACT

A concentrator photovoltaic cell includes a light condenser element configured to condense light, a first photoelectric conversion cell configured to perform a photoelectric conversion, a second photoelectric conversion cell configured to perform a photoelectric conversion, a first output circuit configured to output a first output current which is output by the first photoelectric conversion cell, and a second output circuit configured to output a second output current which is output by the second photoelectric conversion cell.

20 Claims, 9 Drawing Sheets

(51) Int. Cl.
*H01L 31/0687* (2012.01)
*H01L 31/0312* (2006.01)

(56) References Cited

U.S. PATENT DOCUMENTS

| | | | | |
|---|---|---|---|---|
| 4,847,669 A | * | 7/1989 | Yamazaki | H01L 31/076 |
| | | | | 136/251 |
| 5,123,968 A | * | 6/1992 | Fraas | H01L 31/02168 |
| | | | | 136/246 |
| 2008/0087323 A1 | * | 4/2008 | Araki | H01L 31/0543 |
| | | | | 136/256 |
| 2009/0014061 A1 | * | 1/2009 | Harris, Jr. | H01L 31/0304 |
| | | | | 136/255 |
| 2009/0025790 A1 | * | 1/2009 | Chen | H01L 31/022466 |
| | | | | 136/261 |
| 2009/0107541 A1 | * | 4/2009 | Linke | H01L 31/048 |
| | | | | 136/246 |
| 2009/0183762 A1 | * | 7/2009 | Jackson | H01L 31/02021 |
| | | | | 136/246 |
| 2010/0084924 A1 | * | 4/2010 | Frolov | H01L 31/02021 |
| | | | | 307/82 |
| 2010/0132793 A1 | * | 6/2010 | Nakamua | H01L 31/048 |
| | | | | 136/259 |
| 2011/0061726 A1 | * | 3/2011 | Barnett | G02B 27/1006 |
| | | | | 136/255 |
| 2013/0206219 A1 | * | 8/2013 | Kurtin | H01L 31/02168 |
| | | | | 136/255 |
| 2014/0261652 A1 | | 9/2014 | Lochtefeld | |
| 2016/0005911 A1 | | 1/2016 | Sato | |

FOREIGN PATENT DOCUMENTS

| | | |
|---|---|---|
| JP | 2007-201109 | 8/2007 |
| JP | 2009-545182 | 12/2009 |
| JP | 2011-077295 | 4/2011 |
| JP | 2012-182328 | 9/2012 |
| JP | 2014-123712 | 7/2014 |
| JP | 2014-199915 | 10/2014 |
| WO | 2008/091290 A2 | 7/2008 |
| WO | 2014/081048 A1 | 5/2014 |

OTHER PUBLICATIONS

Office Action dated Jul. 30, 2019 in Japanese Patent Application No. 2015-226716, 3 pages.

* cited by examiner

CONCENTRATOR PHOTOVOLTAIC CELL

BACKGROUND OF THE INVENTION

1. Field of the Invention

The disclosures herein generally relate to a concentrator photovoltaic cell.

2. Description of the Related Art

A concentrator solar power generation unit which includes a first optical system for concentrating a solar light, a solar battery cell, and a columnar optical member made of glass containing sodium is known. The columnar optical member is vertically arranged directly above the solar battery cell such that a bottom edge surface of the columnar optical member faces the solar battery cell. The columnar optical member guides the solar light concentrated by the first optical system to the solar battery cell. The concentrator solar power generation unit also includes a sealing resin which covers the columnar optical member and the solar battery cell which faces the bottom edge surface of the columnar optical member. The sealing resin contains at least 10 weight percent of a fluorinated silicone resin.

The solar battery cell, such as InGaP/InGaAs/Ge, has a multi-junction structure which is formed on a chip by the crystal growth of a group III-V compound semiconductor, on a single crystalline substrate such as GaAs. The multi-junction structure includes plural types of p-n junctions whose absorption wavelengths are different from each other, which may be layers including a bottom junction layer, an intermediate junction layer, and an upper junction layer, laminated sequentially (Japanese Unexamined Patent Application Publication No. 2007-201109, Sol. Energy Mater. Sol. Cells 90 (2006) p. 3068.).

The concentrator photovoltaic cell in the related art uses the solar battery cell which faces the bottom edge surface of the columnar optical member to perform a photoelectric conversion of the light concentrated by the first optical system and the columnar optical member which is a second optical system.

The solar battery cell has a multi-junction structure where a plurality of cells are connected in series and the band gap of each cell decreases from a front side to a back side in a light incident direction. This arrangement series absorb light from shorter wavelength to longer wavelength successively, from the front side to the back side in the light incident direction.

It may be noted that the short wavelength light is easier to be scattered by minute particles in the atmosphere than the long wavelength light. In particular, a period of time such as the morning and evening, in which a light path in the atmosphere is longer than that of the daytime, the short wavelength light is easier to be scattered by minute particles in the atmosphere than the long wavelength light. As a result, the performance of the multi-junctional solar battery cell is limited by a lower current amount of the short wavelength range cell in the morning and evening, resulting in overall efficiency being decreased.

The lower the visibility becomes due to an atmospheric condition, the more prominent such a phenomenon becomes. This is because the short wavelength light is scattered by minute particles floating in the atmosphere, resulting in received light quantity of the short wavelength light having a high energy being lowered.

As mentioned above, the conversion efficiency of the concentrator solar power generation unit in the related art is limited by the performance of the short wavelength cells.

SUMMARY OF THE INVENTION

It is a general object of at least one embodiment of the present invention to provide a concentrator photovoltaic cell that substantially obviates one or more problems caused by the limitations and disadvantages of the related art.

In one embodiment, a concentrator photovoltaic cell includes a light condenser element configured to condense light, a first photoelectric conversion cell disposed on a light incident surface of the light condenser element, a light emitting surface of the light condenser element or further downstream from the light condenser element in a light incident path, and configured to perform a photoelectric conversion, the first photoelectric conversion cell having a first band gap, a second photoelectric conversion cell disposed further downstream from the first photoelectric conversion cell in the light incident path, and configured to perform a photoelectric conversion, the second photoelectric conversion cell having a second band gap which is smaller than the first band gap, a first output circuit configured to output a first output current which is output by the first photoelectric conversion cell, and a second output circuit disposed independently of the first output circuit and configured to output a second output current which is output by the second photoelectric conversion cell.

DESCRIPTION OF THE PREFERRED EMBODIMENTS

In the following, embodiments of the present invention will be described with reference to the accompanying drawings.

The First Embodiment

Figure 1:
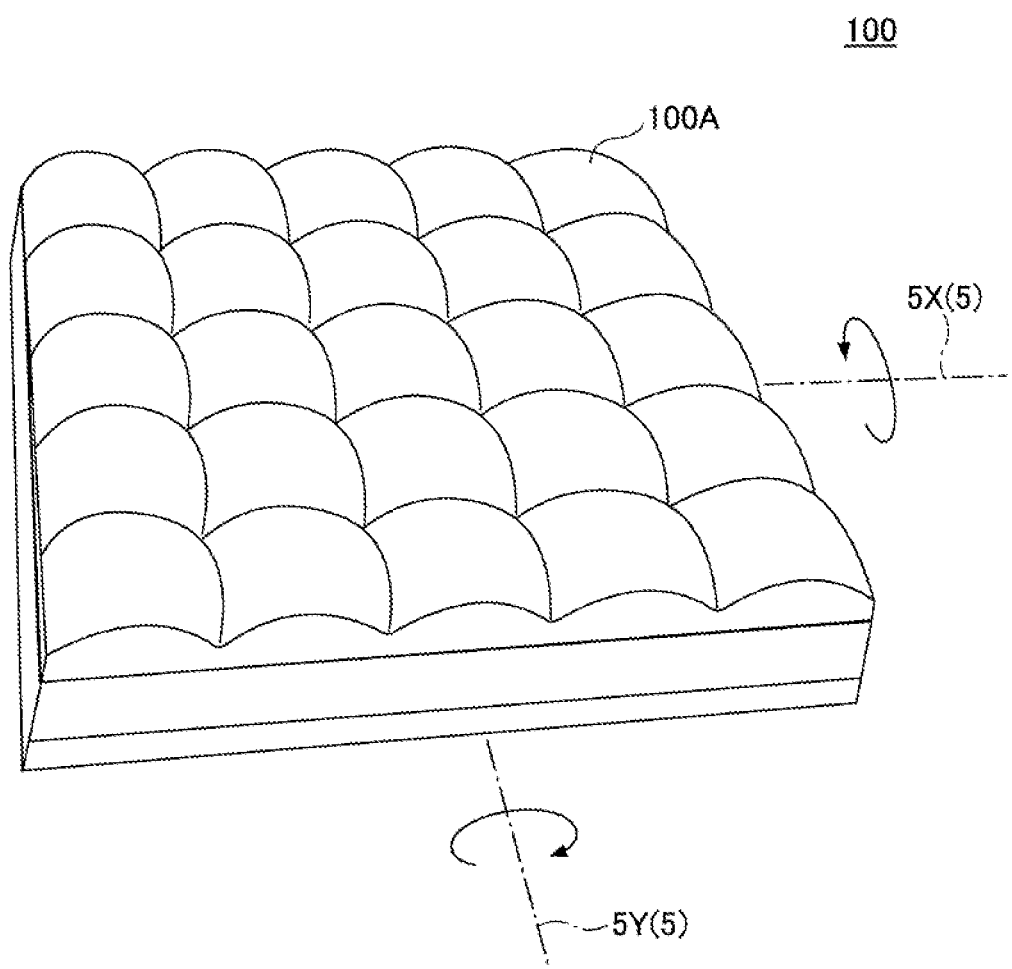
FIG. 1 is a drawing illustrating a concentrator photovoltaic cell module according to a first embodiment.

FIG. 1 is a drawing of a concentrator photovoltaic cell module 100 according to the first embodiment.

The concentrator photovoltaic cell module 100 includes a plurality of concentrator photovoltaic cells 100A arranged in a matrix. FIG. 1 illustrates 25 concentrator photovoltaic cells 100A (5 rows and 5 columns). Note that more concentrator photovoltaic cells 100A may be arranged.

The concentrator photovoltaic cell module 100 includes a solar tracking mechanism 5 which tracks a solar light. The solar tracking mechanism 5 is used to adjust an angle of the concentrator photovoltaic cells 100A such that an angle of incident light to the concentrator photovoltaic cells 100A becomes an optimum angle in response to a movement of the sun from sunrise to sundown. The solar tracking mechanism 5 includes a shaft 5X and a shaft 5Y for adjusting angles in two-axis directions respectively, and adjusts the angle of the concentrator photovoltaic cells 100A to a position of the sun.

Although the concentrator photovoltaic cell module 100 according to the first embodiment includes the solar tracking mechanism 5, the solar tracking mechanism 5 may not be necessarily essential for the concentrator photovoltaic cell module 100.

According to the concentrator photovoltaic cell module 100, an output circuit of a cell for a short wavelength light arranged first (forefront) in a light incident path is independent of other output circuits of cells in order to control a degradation of overall efficiency caused by a prominent scattering of the short wavelength light in comparison with a scattering of a long wavelength light in a period of time where a light path in the atmosphere is longer than that of the daytime, such as the morning and evening.

According to such a structure, the concentrator photovoltaic cell module 100 prevents the limitation of the conversion efficiency of the cell for the short wavelength range light in order to enhance the conversion efficiency.

Figure 2A:
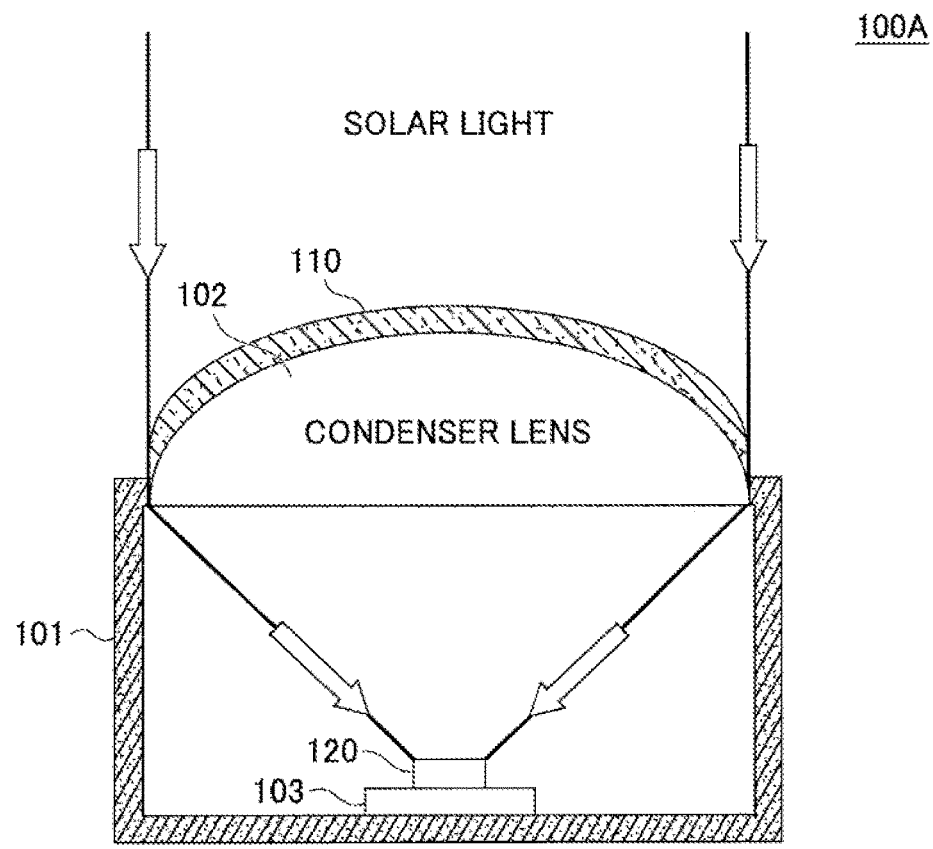
FIG. 2A is a drawing illustrating a cross-sectional structure of the concentrator photovoltaic cell.

FIG. 2A is a drawing illustrating a cross-sectional structure of the concentrator photovoltaic cell 100A.

The concentrator photovoltaic cell 100A includes a case 101, a condenser lens 102, a radiator plate 103, a photoelectric conversion cell 110, and a photoelectric conversion cell 120. In FIG. 2A, arrows and thick solid lines illustrate the light incident path.

The case 101 holds the condenser lens 102 on which the photoelectric conversion cell 110 is arranged. The case 101 contains the radiator plate 103 and the photoelectric conversion cell 120 inside thereof at a back side (a downstream side) in the light incident path. Inside of the case 101, the photoelectric conversion cell 120 is installed on the radiator plate 103.

It suffices for the case 101 to contain the radiator plate 103 and the photoelectric conversion cell 120 inside thereof and to hold the condenser lens 102 at a front side (an upstream side) in the light incident path with respect to the photoelectric conversion cell 120. Although FIG. 2A illustrates a single photoelectric conversion cell 110 and a single photoelectric conversion cell 120 are provided on a single case 101, the case 101 may be a single box-shaped case provided for the entirety of concentrator photovoltaic cells 100A arranged in a matrix as illustrated in FIG. 1. Also, the plurality of concentrator photovoltaic cells 100A arranged in a matrix may be divided into groups, and the case 101 may be provided for each group.

The condenser lens 102 is held by the case 101 and the photoelectric conversion cell 110 is formed on the light incident surface of the condenser lens 102. The condenser lens 102 condenses light having passed through the photoelectric conversion cell 110 to guide the condensed light to the photoelectric conversion cell 120 as illustrated by arrows and thick solid lines in FIG. 2A. The condenser lens 102 is an example of a light condenser element.

As illustrated in FIG. 1, the condenser lens 102 has an approximately square shape as viewed in planar view (in a plan view). The condenser lens 102 is a convex lens whose incident light surface (the top face) is a convex shape and whose light emitting surface (the bottom face) is a flat shape. The condenser lens 102 condenses the light to the photoelectric conversion cell 120 positioned at the center of the condenser lens 102 as viewed in planar view.

A focal length and a curvature of the condenser lens 102 are adjusted such that the size of the condenser lens 102 matches with the size of the photoelectric conversion cell 120 in planar view. Also, the case 101 is designed to satisfy such a positional relationship between the condenser lens 102 and the photoelectric conversion cell 120. For example, a Fresnel lens may be used as the condenser lens 102.

The radiator plate 103 is disposed on the bottom surface of the inside of the case 101, and the photoelectric conversion cell 120 is installed on the radiator plate 103. The radiator plate 103 is disposed in order to radiate heat generated from the photoelectric conversion cell 120 to the case 101 or the atmosphere. As long as the photoelectric conversion cell 120 is cooled, various forms may be used as the radiator plate 103. For example, a high thermal conductive sheet may be used as the radiator plate 103. The radiator plate 103 is an example of a radiator element.

The photoelectric conversion cell 110 is a photoelectric conversion cell which is disposed at the fore front of the light incident path of the concentrator photovoltaic cell module 100. Accordingly, a band gap of the photoelectric conversion cell 110 is the widest (the largest band gap) among the photoelectric conversion cells included in the concentrator photovoltaic cell module 100, and the photoelectric conversion cell 110 is a photoelectric conversion cell which absorbs the shortest wavelength range light.

An amorphous silicon cell may be used as the photoelectric conversion cell 110. The light having passed through the photoelectric conversion cell 110 is condensed by the condenser lens 102, and photoelectric conversion is performed at the photoelectric conversion cell 120.

According to the concentrator photovoltaic cell module 100, the output circuit of the photoelectric conversion cell 110 for the short wavelength range light is independent of the output circuit of the photoelectric conversion cell 120 in order to control the degradation of overall efficiency caused by the greater scattering of the short wavelength light than the scattering of a long wavelength light during a time period such as morning hours or evening hours in which a light path in the atmosphere is longer than that of the daytime.

With this configuration, the concentrator photovoltaic cell module 100 prevents the limitation of the conversion efficiency of the cell for the short wavelength range light, thereby enhancing the conversion efficiency.

The photoelectric conversion cell 120 is a cell which absorbs the longer wavelength range light than the photoelectric conversion cell 110 does. The photoelectric conversion cell 120 may include a plurality of cells. For example, the photoelectric conversion cell 120 may include two cells which are connected in series along the light incident path.

Figure 2B:
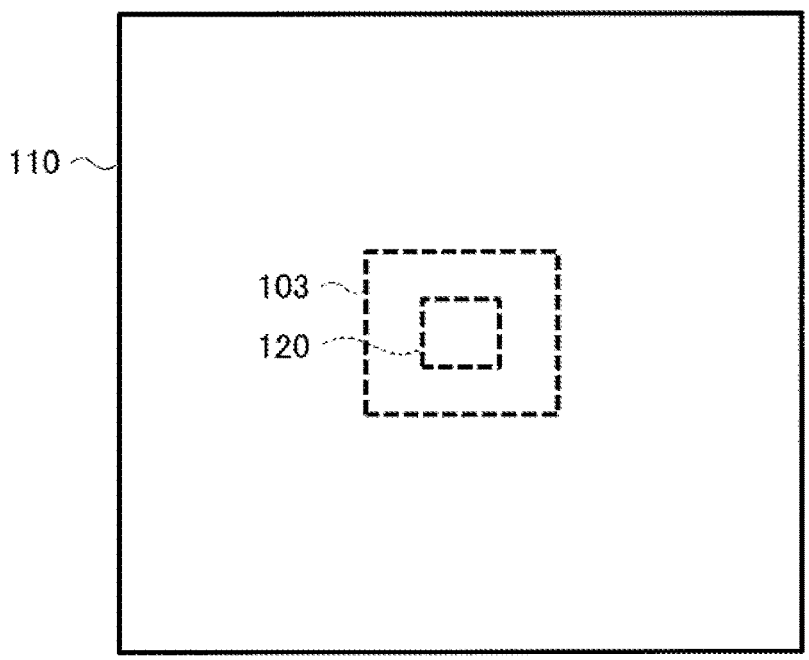
FIG. 2B is a drawing illustrating a plan view of photoelectric conversion cells.

The size of the photoelectric conversion cell 120 in planar view is smaller than that of the photoelectric conversion cell 110 because the photoelectric conversion cell 120 performs the photoelectric conversion with the light condensed by the condenser lens 102. Accordingly, the photoelectric conversion cell 120 may include a compound semiconductor cell (a photovoltaic cell) which is made of compound semiconductor. In other words, the size (area) of the photoelectric conversion cell 120, as viewed from a direction in which a plurality of layers of the photoelectric conversion cell 120 are laminated, is smaller than the size (area) of the photoelectric conversion cell 110 as viewed from a direction in which a plurality of layers of the photoelectric conversion cell 110 are laminated. FIG. 2B is a drawing illustrating a plan view of the photoelectric conversion cell 110 and the photoelectric conversion cell 120. As illustrated in FIG. 2B, the photoelectric conversion cell 110 overlaps with the photoelectric conversion cell 120 in planar view. As illustrated in FIG. 2B, the size of the radiator plate 103 is smaller than the size of the photoelectric conversion cell 110 in planar view, and the size of the radiator plate 103 is larger than the size of the photoelectric conversion cell 120 in planar view.

The efficiency of the compound semiconductor photovoltaic cell is approximately two times higher than that of a silicon-based photovoltaic cell. However, the compound semiconductor photovoltaic cell is far more expensive than the silicon-based photovoltaic cell because the substrate is expensive and has a small size.

However, the use of the condenser lens 102 allows the use of the photoelectric conversion cell 120 having a small size, thereby achieving high efficiency and low cost at the same time. Accordingly, the use of the photoelectric conversion cell 120 including the compound semiconductor photovoltaic cell is highly effective.

Moreover, the output circuit of the photoelectric conversion cell 120 is independent of the output circuit of the photoelectric conversion cell 110 in order to prevent a degradation of overall efficiency limited by the photoelectric conversion cell 110 for the short wavelength range light.

In the following, detailed configurations of the photoelectric conversion cell 110 and the photoelectric conversion cell 120 will be described. The photoelectric conversion cell 110 (a top cell) includes an amorphous silicon cell (1.8 eV), and the photoelectric conversion cell 120 is a 2-junction photovoltaic cell (1.40 eV/0.67 eV) which includes a Ga(In)As cell (a middle cell) and a Ge cell (a bottom cell) using a lattice matching material on a Ge substrate whose lattice constant is approximately equal to that of the GaAs.

Figure 3A:
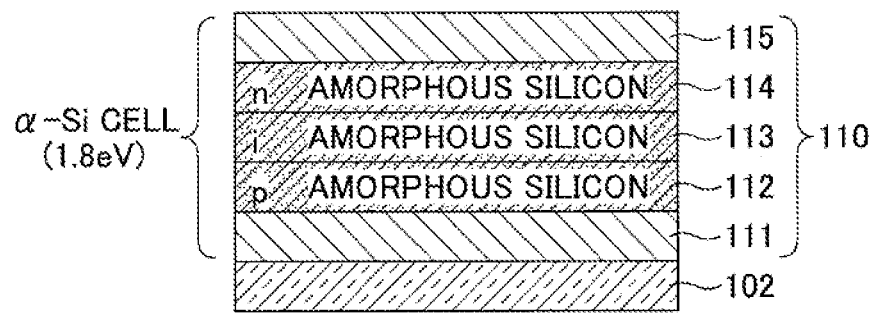
FIGS. 3A and 3B are drawings illustrating the configurations of the photoelectric conversion cells.
Figure 3B:
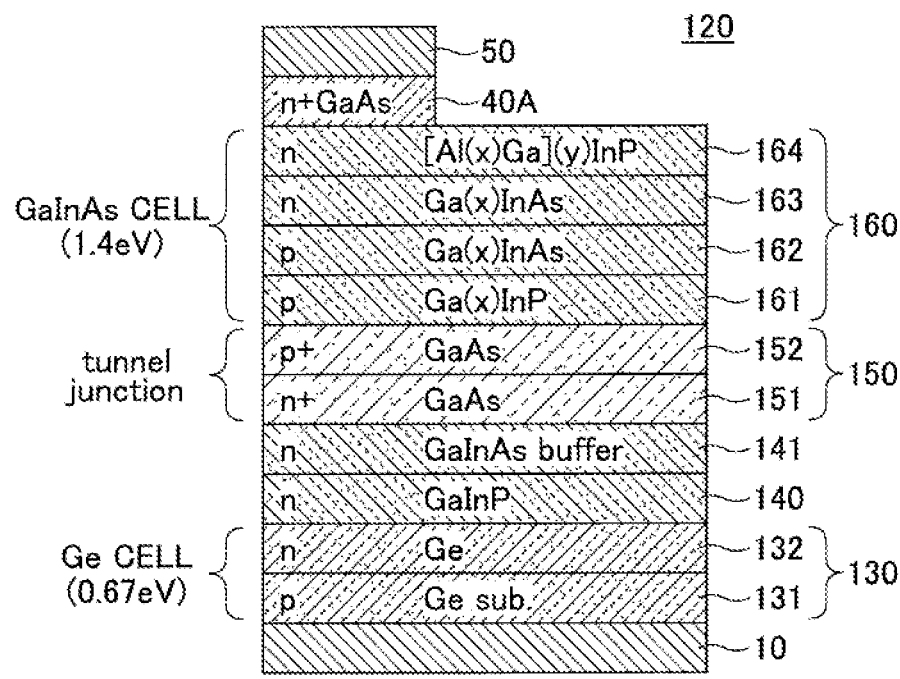

FIGS. 3A and 3B are drawings illustrating the configurations of the photoelectric conversion cell 110 and the photoelectric conversion cell 120. The photoelectric conversion cell 110 is an example of a first photoelectric conversion cell and the photoelectric conversion cell 120 is an example of a second photoelectric conversion cell.

As illustrated in FIG. 3A, the photoelectric conversion cell 110 includes a p-i-n structure made of amorphous silicon. The photoelectric conversion cell 110 includes a transparent electrode 111, a p-type amorphous silicon layer 112, an i-type amorphous silicon layer 113, an n-type amorphous silicon layer 114 and a transparent electrode 115. In the following, the p-type amorphous silicon layer 112, the i-type amorphous silicon layer 113 and the n-type amorphous silicon layer 114 may be referred to as the amorphous silicon layers 112-114.

The transparent electrode 111, the amorphous silicon layers 112-114 and the transparent electrode 115 are laminated on the condenser lens 102 in that order. According to the first embodiment, a band gap of the amorphous silicon layers 112-114 is 1.8 eV.

The transparent electrode 111 and the transparent electrode 115 may be transparent electrodes which transmit a long wavelength light not absorbed by the amorphous silicon layers 112-114. For example, $SnO_2$ (stannic oxide) or the like may be used as the transparent electrode 111 and the transparent electrode 115.

The p-type amorphous silicon layer 112, the i-type amorphous silicon layer 113 and the n-type amorphous silicon layer 114 are film-formed by low temperature plasma CVD (Chemical Vapor Deposition) using $SiH_4$ (silane) diluted with $H_2$ (hydrogen) as a material. For example, the p-type amorphous silicon layer 112 may include boron (B) as an impurity and the n-type amorphous silicon layer 114 may include phosphorus (P) as an impurity.

Note that the photoelectric conversion cell 110 is not limited to the amorphous silicon cell. The photoelectric conversion cell 110 may be a cell including absorbing layers which only absorb the short wavelength light and whose band gap is wide. The photoelectric conversion cell 110 may be made of cadmium telluride (CdTe) or an organic semiconductor material, and so on. The band gap of such a cell which only absorbs the short wavelength light may be about 1.8 eV.

Although not illustrated in FIG. 3A, it may be preferable to form an antireflection film on a light incident side.

As illustrated in FIG. 3B, the photoelectric conversion cell 120 includes a Ge cell 130, an n-type GaInP layer 140, an n-type GaInAs buffer layer 141, a tunnel junction layer 150, a GaInAs cell 160, a contact layer 40A and an electrode 50.

The Ge (germanium) cell 130 is a sub-cell including a p-n junction of Ge. The p-n junction of Ge is formed by an n-type Ge layer 132 being formed on a p-type Ge substrate 131. The Ge cell 130 is a semiconductor sub-cell (a photovoltaic cell). The band gap of the Ge cell 130 is 0.67 eV and the Ge cell 130 is the bottom cell of the concentrator photovoltaic cell module 100.

The n-type Ge layer 132 is formed by diffusion of phosphorus (P) contained in the n-type GaInP layer 140 when the n-type GaInP layer 140 is formed on the p-type Ge substrate 131.

The n-type GaInP layer 140 is formed on the Ge cell 130 as a first layer. The n-type GaInP layer 140 is formed by a MOCVD (Metal Organic Chemical Vapor Deposition) method on the p-type Ge substrate 131. The band gap of the n-type GaInP layer 140 is about 1.86 eV. A composition of indium in the n-type GaInP layer 140 which lattice matches with the Ge is about 49 percent.

When the n-type GaInP layer 140 is formed, the n-type Ge layer 132 is formed on the p-type Ge substrate 131 by diffusion of phosphorus (P) contained in the n-type GaInP layer 140. The n-type GaInP layer 140 is formed for forming the n-type Ge layer 132 by diffusing phosphorus (P) on the p-type Ge substrate 131.

The n-type GaInAs buffer layer 141 is laminated on the n-type GaInP layer 140. The n-type GaInAs buffer layer 141 is formed by the MOCVD method on the n-type GaInP layer 140.

The band gap of the n-type GaInAs buffer layer 141 may be equal to or wider than the band gap of the GaInAs cell 160 which is disposed on a more incident side (upstream side) than the n-type GaInAs buffer layer 141 in the light incident direction. For example, the band gap of the n-type GaInAs buffer layer 141 may be 1.40 eV.

The tunnel junction layer 150 is formed between the n-type GaInAs buffer layer 141 and the GaInAs cell 160. The tunnel junction layer 150 includes a $n^+$-type GaAs layer 151 and a $p^+$-type GaAs layer 152. Te (tellurium) may be used as an impurity for an n-type conductivity, and C (carbon) may be used as an impurity for a p-type conductivity. The n+-type GaAs layer 151 and the p+-type GaAs layer 152 form a thin p-n junction which is doped in high concentration.

Both of a doping concentration of the GaAs layer 151 and the GaAs layer 152 of the tunnel junction layer 150 are higher than that of the GaInAs cell 160. The tunnel junction layer 150 is formed as a junction layer such that a current flows between a Ga(x)InAs layer 162 of the GaInAs cell 160 and the n-type Ge layer 132 of the Ge cell (by the tunnel junction).

Both of the band gap energy of the GaAs layer 151 and 152 of the tunnel junction layer 150 are 1.42 eV.

As for the tunnel junction layer 150, a tunnel junction layer, in which a n+-type GaInP layer and a p+-type AlGaAs layer are connected, may be used instead of the GaAs layer 151 and the GaAs layer 152.

The GaInAs cell 160 includes a p-type Ga(x)InP layer 161, a p-type Ga(x)InAs layer 162, an n-type Ga(x)InAs layer 163 and an n-type [Al(x)Ga](y)InP layer 164.

The GaInAs cell 160 is a GaAs group sub-cell. The GaAs group sub-cell is a sub-cell which nearly lattice matches with GaAs or Ge whose lattice constant is close to that of the GaAs. The GaAs group sub-cell is made of a material group which may form a crystal growth on a GaAs substrate or a Ge substrate. In the following, a material, which may lattice match with GaAs or Ge whose lattice constant is close to that of the GaAs and which may form a crystal growth on a GaAs substrate or a Ge substrate, is referred to as a GaAs lattice matching group material. In the following, a sub-cell formed of the GaAs lattice matching group material is referred to as a GaAs lattice matching group material sub-cell.

In the following, when the Ge substrate 131 is used as the substrate, a sub-cell made of a compound semiconductor, a size of which is equal to or smaller than a critical film thickness and which lattice matches with Ge, is referred to as the GaAs lattice matching group material sub-cell.

The GaInAs cell 160 is a sub-cell that includes a p-n junction of the GaInAs layer 162 and the GaInAs layer 163. A minute amount (about 1 percent) of indium (In) is added to the GaInAs layer 162 and the GaInAs layer 163 respectively such that the GaInAs cell 160 perfectly lattice matches with the Ge cell 130 as a middle cell of the concentrator photovoltaic cell module 100. The band gap of the GaInAs cell 160 is 1.4 eV.

The p-type Ga(x)InP layer 161 is formed as a BSF (Back Surface Field) layer and is formed by a material whose band gap is wider than that of the GaInAs layer 162 and the GaInAs layer 163.

The n-type [Al(x)Ga](y)InP layer 164 is formed as a window layer and formed by a material whose band gap is wider than that of the GaInAs layer 162 and the GaInAs layer 163.

The GaInAs cell 160 is connected to the Ge cell 130 via the tunnel junction layer 150 which includes the n+-type GaAs layer 151 and the p+-type GaAs layer 152.

Mainly, the contact layer 40A is a layer which is laminated on the GaInAs cell 160 so as to form an ohmic contact with the electrode 50. For example, a gallium arsenide (GaAs) layer may be used as the contact layer 40A. Note that the gallium arsenide layer except a part under the electrode 50 may be removed by etching to absorb light before the light is absorbed by the GaInAs cell 160.

A GaInAs layer added with indium which lattice matches with the Ge substrate may be used as the contact layer 40A.

For example, the electrode 50 is a metallic thin film such as Ti/Pt/Au or the like. The electrode 50 is formed on the contact layer 40A. The electrode 50 functions as an upper electrode positioned at the light incident side.

The electrode 10 functions as a lower electrode. The electrode 10 may be formed by Ti/Pt/Au or the like.

Although not illustrated in FIG. 3B, it may be preferable to form an antireflection film on the light incident side.

In the following, an output circuit of the photoelectric conversion cell 110 and an output circuit of the photoelectric conversion cell 120 will be described with reference to FIG. 4.

Figure 4:
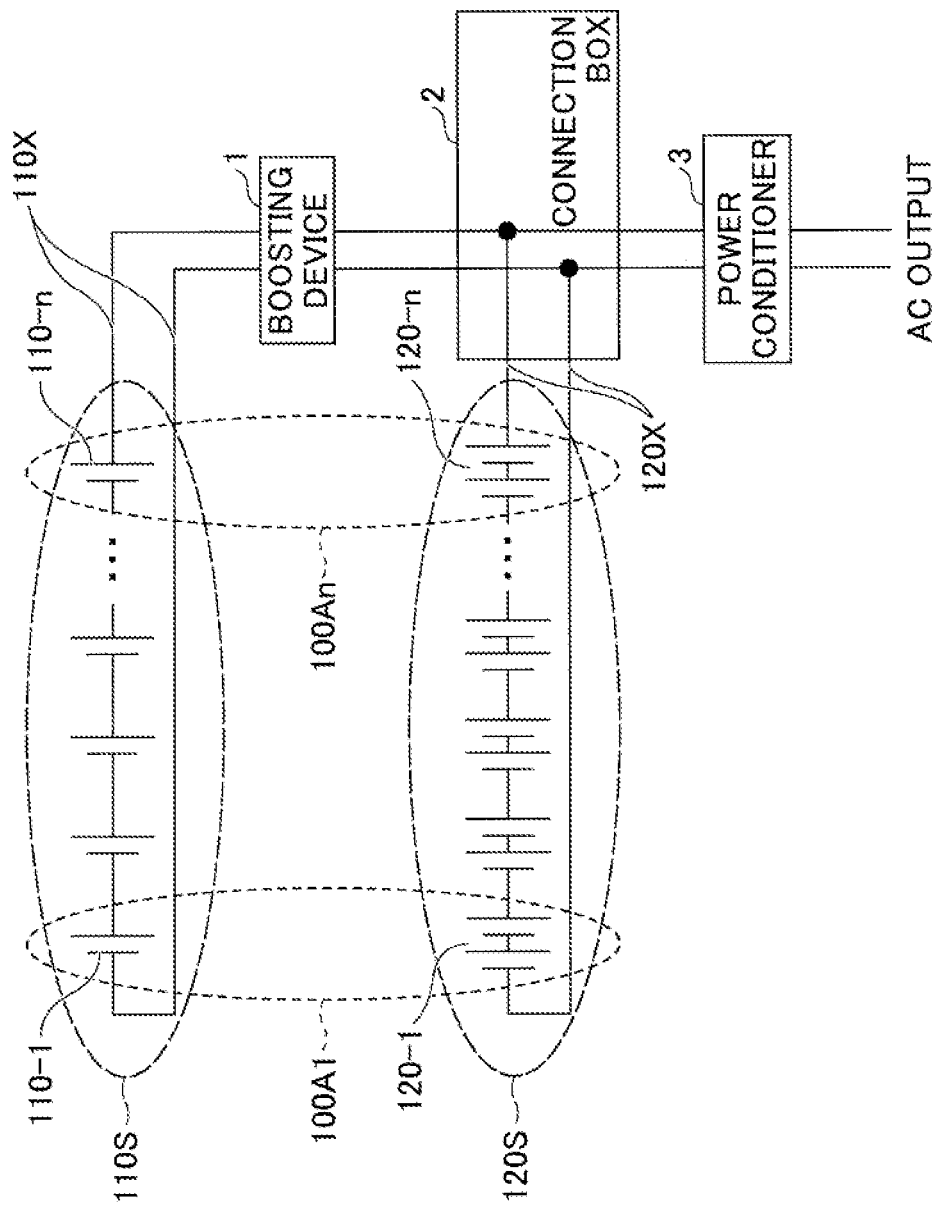
FIG. 4 is a drawing illustrating a connection relation and output circuits of the an n number of concentrator photovoltaic cells contained in the concentrator photovoltaic cell module.

FIG. 4 is a drawing illustrating a connection relation and output circuits of the an n number of concentrator photovoltaic cells 100A contained in the concentrator photovoltaic cell module 100.

As illustrated in FIG. 4, the concentrator photovoltaic cell module 100 may include an n number of (n≥2) concentrator photovoltaic cells 100A1 to 100An. Each of the concentrator photovoltaic cells 100A1 to 100An may include the photoelectric conversion cells 110-1 to 110-n and the photoelectric conversion cells 120-1 to 120-n respectively.

In the following, the an n number of concentrator photovoltaic cells 100A1 to 100An, the an n number of photoelectric conversion cells 110-1 to 110-n and the an n number of photoelectric conversion cells 120-1 to 120-n are referred to as the concentrator photovoltaic cell module 100, the photoelectric conversion cell 110 and the photoelectric conversion cell 120 respectively, when there is no need to distinguish each of them.

The photoelectric conversion cells 110-1 to 110-n are connected in series successively and connected to a connection box 2 via a boosting device 1. The boosting device 1 boosts the output of the photoelectric conversion cells 110-1 to 110-n in order to reduce a voltage difference between the voltages of the photoelectric conversion cells 110-1 to 110-n and the voltages of the photoelectric conversion cells 120-1 to 120-n. Successively connected photoelectric conversion cells 110-1 to 110-n may be defined as a string 110S.

The photoelectric conversion cells 120-1 to 120-n are connected in series successively and connected to the connection box 2. Successively connected photoelectric conversion cells 120-1 to 120-n may be defined as a string 120S. Illustrating each of the photoelectric conversion cells 120-1 to 120-n with two successively connected cells is for indicating the Ge cell 130 and the GaInAs cell 160.

As illustrated in FIG. 4, the concentrator photovoltaic cells 100A1 to 100An are formed by the photoelectric conversion cells 110-1 to 110-n contained in the string 110S and the photoelectric conversion cells 120-1 to 120-n contained in the string 120S.

The connection box 2 connects the photoelectric conversion cells 110-1 to 110-n to the photoelectric conversion cells 120-1 to 120-n in parallel. That is, the photoelectric conversion cells 110-1 to 110-n and the photoelectric conversion cells 120-1 to 120-n are connected to the connection box 2 in parallel. Thus, an electric circuit of the photoelectric conversion cells 110-1 to 110-n (a first output circuit 110X) and an electric circuit of the photoelectric conversion cells 120-1 to 120-n (a second output circuit 120X) are independent of each other. More specifically, the electric circuit of the photoelectric conversion cell 110-1 is independent of the electric circuit of the photoelectric conversion cell 120-1, and the electric circuit of the photoelectric conversion cell 110-n is independent of the electric circuit of the photoelectric conversion cell 120-n (n is an arbitrary integer number).

A power conditioner 3 is connected to the output side of the connection box 2. The power conditioner converts DC power outputted from the photoelectric conversion cell 110S and the photoelectric conversion cell 120S to AC power. An inverter may be used as the power conditioner.

The photoelectric conversion cells 110-1 to 110-n and the photoelectric conversion cells 120-1 to 120-n are connected to the connection box 2 in parallel, and the power conditioner 3 is connected to the output side of the connection box 2 in series. Thus, the photoelectric conversion cells 110-1 to 110-n and the photoelectric conversion cells 120-1 to 120-n are connected to the power conditioner 3 in parallel.

Thus, the circuit from the photoelectric conversion cells 110-1 to 110-n to the power conditioner 3 constitutes the output circuit of the photoelectric conversion cells 110-1 to 110-n, and the circuit from the photoelectric conversion cells 120-1 to 120-n to the power conditioner 3 constitutes the output circuit of the photoelectric conversion cells 120-1 to 120-n.

According to the concentrator photovoltaic cells 100A1 to 100An of the concentrator photovoltaic cell module 100 which include the above mentioned circuit structure, the photoelectric conversion cells 110-1 to 110-n and the photoelectric conversion cells 120-1 to 120-n are not connected in series with each other respectively, but are connected to the power conditioner 3 in parallel.

Thus, the output circuit of the photoelectric conversion cells 110-1 to 110-n and the output circuit of the photoelectric conversion cells 120-1 to 120-n are independent of each other.

Thus, the electric circuit of the photoelectric conversion cells 110-1 to 110-n and the electric circuit of the photoelectric conversion cells 120-1 to 120-n are independent of each other respectively. More specifically, the electric circuit of the photoelectric conversion cell 110-1 is independent of the electric circuit of the photoelectric conversion cell 120-1, and the electric circuit of the photoelectric conversion cell 110-n is independent of the electric circuit of the photoelectric conversion cell 120-n (n is an arbitrary integer number).

According to the concentrator photovoltaic cell module 100, the output of the photoelectric conversion cells 110-1 to 110-n and the output of the photoelectric conversion cells 120-1 to 120-n are obtained independently without influencing on each other. Further, since the photoelectric conversion cells 110-1 to 110-n are connected to the connection box 2 via the boosting device 1, the output of the photoelectric conversion cells 110-1 to 110-n and the output of the photoelectric conversion cells 120-1 to 120-n are obtained together even if the output of the photoelectric conversion cells 110-1 to 110-n decline.

Thus, the influence of efficiency deterioration of the conversion cells 110-1 to 110-n on efficiency of the photoelectric conversion cells 120-1 to 120-n is prevented, in the period of time such as the morning and evening, in which the light path in the atmosphere is longer than that of the daytime and in which the scattering of the short wavelength light is more prominent than that of the long wavelength light.

As mentioned above, the first embodiment provides the concentrator photovoltaic cell module 100 for preventing limitation of the conversion efficiency caused by the cells for short wavelength range light and for improving the conversion efficiency.

According to the concentrator photovoltaic cell module 100, the band gap of the photoelectric conversion cell 110 is 1.8 eV, and the band gap of the GaInAs cell 160 is 1.4 eV, and the band gap of the Ge cell is 0.67 eV.

Thus, the photoelectric conversion may be performed efficiently in a wide wavelength range with 3 types of cells whose band gap are 1.8 eV, 1.4 eV and 0.67 eV respectively.

An electric power of the photoelectric conversion cell 110, which absorbs the short wavelength light whose spectrum easily fluctuates according to the time range and fluctuations of the seasons or weather conditions or the like, is recovered independently of the photoelectric conversion cell 120.

Thus, even if the conversion efficiency of the photoelectric conversion cell 110 whose band gap is 1.8 eV decreases due to scattering of the short wavelength light or the like, the conversion efficiencies of the GaInAs cell 160 whose band gap is 1.4 eV and the Ge cell 130 whose band gap is 0.67 eV are not affected.

As mentioned above, the concentrator photovoltaic cell module 100 may reduce the fluctuation of electric power generation amount with respect to the fluctuation of the light spectrum in comparison with the related art, and may have high power electric generation efficiency.

Further, since the photoelectric conversion cells 110-1 to 110-n are connected to the connection box 2 via the boosting device 1, the output of the photoelectric conversion cells 110-1 to 110-n and the output of the photoelectric conversion cells 120-1 to 120-n are obtained together even if the output of the photoelectric conversion cells 110-1 to 110-n decline.

Although a method in which the boosting device and the connection box collect each of the strings and connect each of the strings to the single power conditioner is described above, the present invention is not limited to this. For example, a method in which each of the strings may be connected to each of power conditioners whose maximum power point tracking (MPPT) are different from each other may be used. Further, a method in which a multi string type power conditioner which performs maximum power point tracking (MPPT) control for each of the strings may without using the boosting device and the connection box, may be used. According to these two methods, the more high efficiency concentrator photovoltaic cell module 100 may be provided.

The photoelectric conversion cell 120 including the sub-cell made of the compound semiconductor material may be miniaturized by guiding light condensed by the condenser lens 102 to the photoelectric conversion cell 120. Thus, the cost of the concentrator photovoltaic cell module 100 may be reduced.

Because the band gap energy and the lattice constant of the compound semiconductor differ caused by the material composition, a multi-junction photovoltaic cell, which divides absorbing wave length ranges of solar light and raises energy conversion efficiency, has been made. A plurality of the cells are connected in series in the multi-junction cell.

A 3-junction photovoltaic cell is widely used that includes Ge cell/Ga(In)As cell/GaInP cell (band gap of each cell: 1.88 eV/1.40 eV/0.67 eV) using the lattice matching material on a Ge substrate whose lattice constant is approximately equal to that of the GaAs.

The efficiency of the compound semiconductor photovoltaic cell is approximately 2 times higher than that of a silicon-based photovoltaic cell. However, the compound semiconductor photovoltaic cell is far more expensive than the silicon-based photovoltaic cell because the substrate is expensive and has a small size. Thus, the compound semiconductor photovoltaic cell has been used in special purposes such as space use, an artificial satellite use or the like.

Nowadays, a concentrator photovoltaic cell formed by a low cost plastic lens and a small photovoltaic cell is put into practical use for the ground use (general-purpose use on the ground). Such a concentrator cell may reduce the amount of high cost compound semiconductor which is more expensive than general flat plate type cells, resulting in a low cost concentrator cell being provided.

However, improvement of the energy conversion efficiency and reduction of manufacturing cost are desired, because not only the electric power generation cost of the compound semiconductor photovoltaic cell but also the electric power generation cost of the silicon-based photovoltaic cell is high.

According to the concentrator photovoltaic cell module 100 of the first embodiment, the photoelectric conversion cell 110 made of amorphous silicon, whose cost is relatively low, is formed on the condenser lens 102, and the light condensed by the condenser lens 102 is guided to the photoelectric conversion cell 120. This enables the photoelectric conversion cell 120 whose cost is relatively high to be minimized.

The photoelectric conversion cell 110 and the photoelectric conversion cell 120 are connected to the power conditioner 3 (illustrated in FIG. 4) in parallel. Thus, the output circuit of the photoelectric conversion cell 110 and the output circuit of the photoelectric conversion cell 120 are independent of each other, and a performance characteristic of the photoelectric conversion cell 110 is not limited by the output current of the photoelectric conversion cell 120, and vice versa.

According to the concentrator photovoltaic cell module 100 of the first embodiment having such a structure, both cost reduction and efficiency improvement may be achieved.

Although the photoelectric conversion cell 120 of the first embodiment includes the semiconductor sub-cell and the compound semiconductor cell, the photoelectric conversion cell 120 may not include the compound semiconductor cell and may just include one or more semiconductor cells.

Figure 5:
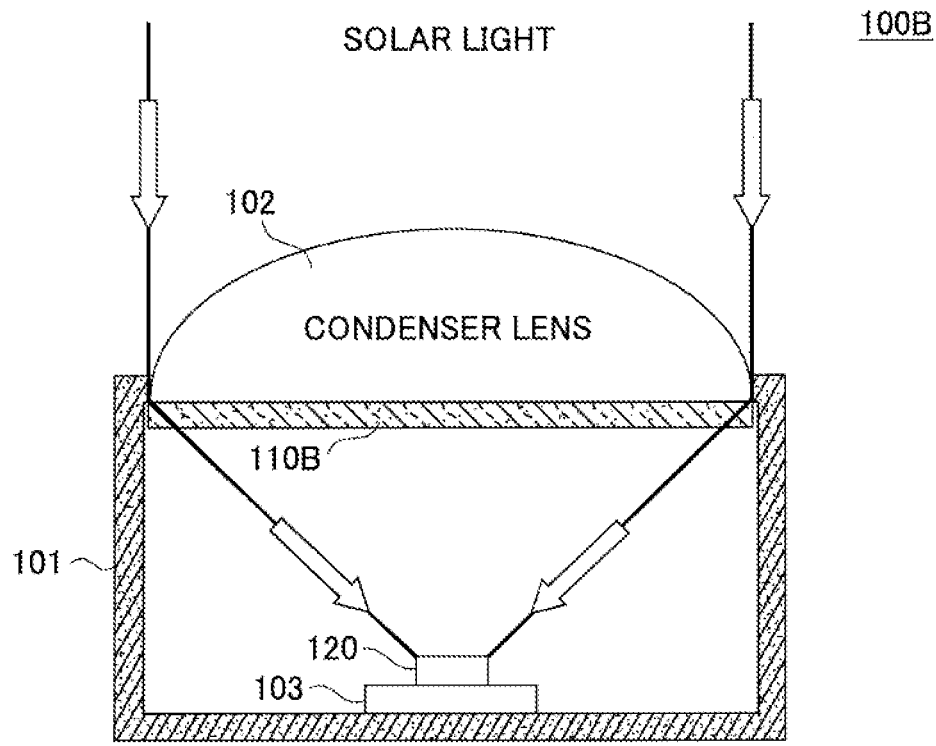
FIG. 5 is a drawing illustrating a cross-sectional structure of a concentrator photovoltaic cell of a first variation of the first embodiment.

Although the photoelectric conversion cell 110 is formed on the light incident surface side of the condenser lens 102, the photoelectric conversion cell 110 may be formed on the light emitting surface of the condenser lens 102 like a first variation of the first embodiment illustrated in FIG. 5.

FIG. 5 is a drawing illustrating a cross-sectional structure of a concentrator photovoltaic cell 100B of the first variation of the first embodiment.

The concentrator photovoltaic cell 100B includes the case 101, the condenser lens 102, the radiator plate 103, the photoelectric conversion cell 110B, and the photoelectric conversion cell 120. In FIG. 5, arrows and thick solid lines illustrate the light incident path. The photoelectric conversion cell 110B is formed on the light incident surface side of the condenser lens 102. Other configurations of the concentrator photovoltaic cell 100B are similar to the concentrator photovoltaic cell 100A.

According to the concentrator photovoltaic cell 100B, both of the photoelectric conversion cell 110B and the photoelectric conversion cell 120 may be arranged in a space formed between the case 101 and the condenser lens 102. Thus, the photoelectric conversion cell 110B is not exposed to the outside, resulting in durability being improved.

Note that the photoelectric conversion cell 110B is not necessarily arranged on the light emitting surface. The photoelectric conversion cell 110B may be arranged between the condenser lens 102 and the photoelectric conversion cell 120 as illustrated in FIG. 6.

Figure 6:
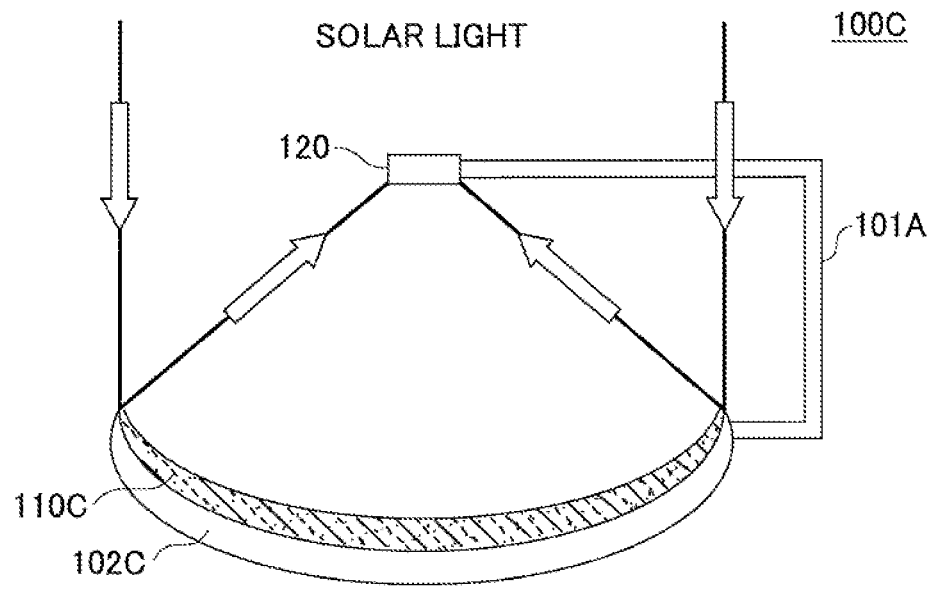
FIG. 6 is a drawing illustrating a cross-sectional structure of a concentrator photovoltaic cell of a second variation of the first embodiment.

FIG. 6 is a drawing illustrating a cross-sectional structure of a concentrator photovoltaic cell of a second variation of the first embodiment.

Figure 7:
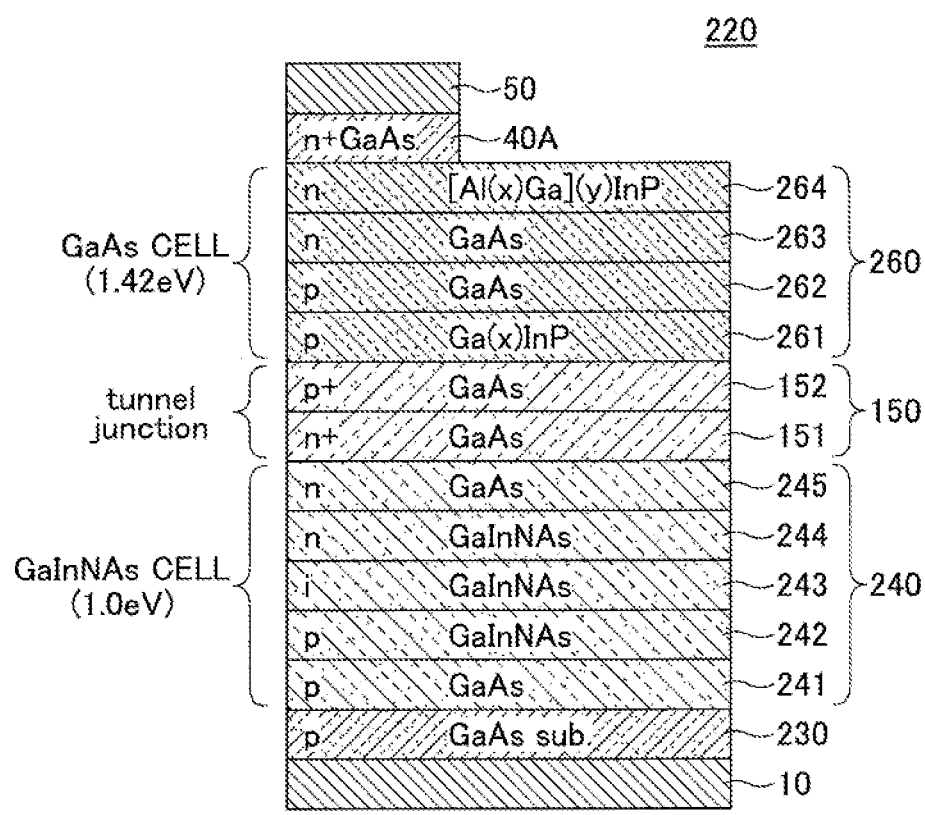
FIG. 7 is a drawing illustrating a cross-sectional structure of a concentrator photovoltaic cell of a second embodiment.

FIG. 7 is a drawing illustrating a cross-sectional structure of a concentrator photovoltaic cell 100C of a second embodiment.

The concentrator photovoltaic cell 100C includes a stay 101A, a condenser mirror 102C, a photoelectric conversion cell 110C, and the photoelectric conversion cell 120. In FIG. 6, arrows and thick solid lines illustrate the light incident path. The photoelectric conversion cell 110C is formed on a reflecting surface of the condenser mirror 102C.

Light, which penetrates the photoelectric conversion cell 110C, is reflected by the condenser mirror 102C, and penetrates the photoelectric conversion cell 110C again, and enters the photoelectric conversion cell 120. A bottom side of the photoelectric conversion cell 120 is the light incident surface in FIG. 6. Thus, the photoelectric conversion cell 120 of the concentrator photovoltaic cell 100C (FIG. 6) is arranged upside down with respect to the photoelectric conversion cell 120 of the concentrator photovoltaic cell 100A (FIG. 2A) and the photoelectric conversion cell 120 of the concentrator photovoltaic cell 100B (FIG. 5).

The photoelectric conversion cell 120 is fixed to the condenser mirror 102C with the stay 101A near a focus point of the condenser mirror 102C.

The concentrator photovoltaic cell 100C has an effect similar to the concentrator photovoltaic cell 100A and the concentrator photovoltaic cell 100B with the condenser lens 102. It is preferable to form a reflection film between the photoelectric conversion cell 110 and the condenser mirror 102C.

A Second Embodiment

According to a concentrator photovoltaic cell module of the second embodiment, the photoelectric conversion cell 120 of the concentrator photovoltaic cell module 100 of the first embodiment is changed. Other structures of the second embodiment are similar to the first embodiment. Thus, same reference signs are used for the other structures and a description of the other structures is appropriately omitted.

FIG. 7 is a drawing illustrating a cross-sectional structure of a photoelectric conversion cell 220 of the concentrator photovoltaic cell module of the second embodiment. The photoelectric conversion cell 220 is used instead of the photoelectric conversion cell 120 illustrated in FIG. 3B.

The photoelectric conversion cell 220 includes an electrode 10, a GaAs substrate 230, a GaInNAs cell 240, a tunnel junction layer 150, a GaAs cell 260, a contact layer 40A and an electrode 50. Both of the GaInNAs cell 240 and the GaAs cell 260 lattice match with the GaAs substrate 230.

Both of the GaInNAs cell 240 and the GaAs cell 260 are GaAs group sub-cells. The GaAs group sub-cell is a sub-cell made of a material group which may form a crystal growth on a GaAs substrate or a Ge substrate. The material group lattice matches with GaAs or Ge whose lattice constant is close to that of the GaAs. In the following, a material, which may lattice match with GaAs or Ge whose lattice constant is close to that of the GaAs and which may form a crystal growth on a GaAs substrate or a Ge substrate, is referred to as a GaAs lattice matching group material. In the following, a sub-cell formed of the GaAs lattice matching group material is referred to as a GaAs lattice matching group material sub-cell.

The GaAs substrate 230 is a p-type GaAs substrate. The GaInNAs cell 240 is laminated on the GaAs substrate 230.

The GaInNAs cell 240 includes a p-type GaAs layer 241, a p-type GaInNAs layer 242, an i-type GaInNAs layer 243, an n-type GaInNAs layer 244 and an n-type GaAs layer 245.

These five layers are laminated successively on the GaAs substrate 230 in that order. The band gap of the GaInNAs cell 240 is 1.0 eV.

The p-type GaAs layer 241, the p-type GaInNAs layer 242, the i-type GaInNAs layer 243, the n-type GaInNAs layer 244 and the n-type GaAs layer 245 may be formed by the MOCVD method.

Zinc (Zn) may be used as an impurity for forming the p-type GaAs layer 241 and the p-type GaInNAs layer 242. Silicon (Si) may be used as an impurity for forming the n-type GaInNAs layer 244 and the n-type GaAs layer 245.

The p-type GaAs layer 241 is formed as a BSF (Back Surface Field) layer and formed by a material whose band gap is wider than that of the p-type GaInNAs layer 242, the i-type GaInNAs layer 243 and the n-type GaInNAs layer 244.

The n-type GaAs layer 245 is formed as a window layer and formed by a material whose band gap is wider than that of the p-type GaInNAs layer 242, the i-type GaInNAs layer 243 and the n-type GaInNAs layer 244.

The GaAs cell 260 includes a p-type Ga(x)InP layer 261, a p-type GaAs layer 262, an n-type GaAs layer 263 and an n-type [Al(x)Ga](y)InP layer 264. These four layers are laminated successively on the tunnel junction layer 150 in that order. The band gap of the GaAs cell 260 is 1.42 eV.

The p-type Ga(x)InP layer 261, the p-type GaAs layer 262, the n-type GaAs layer 263 and the n-type [Al(x)Ga](y)InP layer 264 may be formed by the MOCVD method.

Zinc (Zn) may be used as an impurity for forming the p-type Ga(x)InP layer 261 and the p-type GaAs layer 262. Silicon (Si) may be used as an impurity for forming the n-type GaAs layer 263 and the n-type [Al(x)Ga](y)InP layer 264.

The p-type Ga(x)InP layer 261 is formed as a BSF (Back Surface Field) layer and formed by a material whose band gap is wider than that of the p-type GaAs layer 262 and the n-type GaAs layer 263.

The n-type [Al(x)Ga](y)InP layer 264 is formed as a window layer and formed by a material whose band gap is wider than that of the p-type GaAs layer 262 and the n-type GaAs layer 263.

A tunnel junction layer formed by a connection of a n$^+$-type GaInP layer and a p$^+$-type AlGaAs layer may be used instead of the tunnel junction layer 150 (the n$^+$-type GaAs layer 151 and the p$^+$-type GaAs layer 152) which is formed between the GaInNAs cell 240 and the GaAs cell 260.

The concentrator photovoltaic cell module of the second embodiment has characteristics similar to a multi-junction photovoltaic cell which uses three cells connected in series whose band gaps are 1.8 eV/1.4 eV/1.0 eV, basically.

As mentioned above, the second embodiment may prevent limitation of the conversion efficiency caused by the cells for short wavelength range light and improve the conversion efficiency.

An electric power of the photoelectric conversion cell 110, which absorbs the short wavelength light whose spectrum is easily fluctuates according to the time range and fluctuations of the seasons or weather conditions or the like, is recovered independently of the photoelectric conversion cell 220.

Thus, even if the conversion efficiency of the photoelectric conversion cell 110 whose band gap is 1.8 eV decreases due to scattering of the short wavelength light or the like, conversion efficiencies of the GaAs cell 260 whose band gap is 1.42 eV and the GaInNAs cell 240 whose band gap is 1.0 eV are not affected.

As mentioned above, the concentrator photovoltaic cell module, which may reduce the fluctuation of power generation amount with respect to the fluctuation of the spectrum in comparison with the related art, and which may have high power generation efficiency, may be provided.

The photoelectric conversion cell 220 including the sub-cell made of compound semiconductor material may be miniaturized by guiding light condensed by the condenser lens 102 to the photoelectric conversion cell 220. Thus, the cost of the concentrator photovoltaic cell module may be reduced.

Output voltage and conversion efficiency of the concentrator photovoltaic cell module of the second embodiment may increase in comparison with the concentrator photovoltaic cell module 100 of the first embodiment, because the second embodiment uses the GaInNAs cell 240 whose band gap is 1.0 eV as the bottom cell and the first embodiment uses the Ge cell 130 whose band gap is 0.67 eV as the bottom cell.

Although a band gap balance of a lattice matching type 3-junction photovoltaic cell with the Ge substrate which is used mainly at present is not optimum in terms of current balance, the second embodiment may prevent limitation of the conversion efficiency caused by the cells for short wavelength range light and improve the conversion efficiency.

The Third Embodiment

According to a concentrator photovoltaic cell module of the third embodiment, the photoelectric conversion cell 120 of the concentrator photovoltaic cell module 100 of the first embodiment is changed. Other structures of the third embodiment are similar to the first embodiment. Thus, same reference signs are used for the other structures and a description of the other structures is appropriately omitted.

Figure 8:
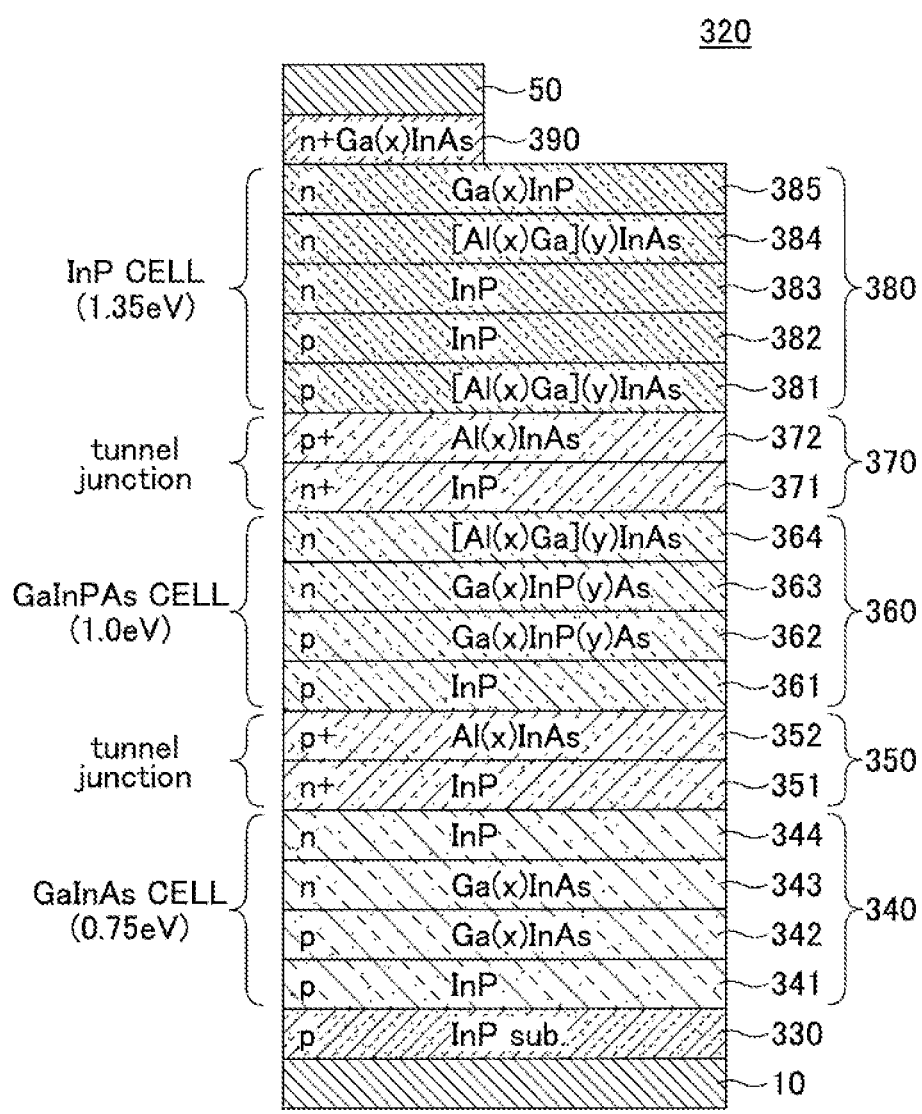
FIG. 8 is a drawing illustrating a cross-sectional structure of a photoelectric conversion cell of the concentrator photovoltaic cell module of a third embodiment.

FIG. 8 is a drawing illustrating a cross-sectional structure of a photoelectric conversion cell 320 of the concentrator photovoltaic cell module of the third embodiment. The photoelectric conversion cell 320 is used instead of the photoelectric conversion cell 120 illustrated in FIG. 3B.

The photoelectric conversion cell 320 includes an electrode 10, an InP substrate 330, a GaInNAs cell 340, a tunnel junction layer 350, a GaInPAs cell 360, a tunnel junction layer 370, an InP cell 380, a contact layer 390A and an electrode 50.

The GaInNAs cell 340, the GaInPAs cell 360, and the InP cell 380 lattice match with the InP substrate 330.

The GaInNAs cell 340, the GaInPAs cell 360 and the InP cell 380 are sub-cells (InP group sub-cells) made of a material group which nearly lattice match with InP and which may form a crystal growth on a InP substrate 330. In the following, a material, which nearly lattice matches with InP and which forms a crystal growth on a InP substrate 330, is referred to as an InP lattice matching group material. In the following, a sub-cell formed of the InP lattice matching group material is referred to as an InP lattice matching group material sub-cell.

The InP substrate 330 is a p-type indium phosphide (InP) substrate.

The GaInNAs cell 340 is laminated on the InP substrate 330, and includes a p-type InP layer 341, a p-type Ga(x)InAs layer 342, an n-type Ga(x)InAs layer 343, and an n-type InP layer 344. These four layers are laminated successively on the InP substrate 330 in that order. The band gap of the GaInNAs cell 340 is 0.75 eV.

The p-type InP layer 341, the p-type Ga(x)InAs layer 342, the n-type Ga(x)InAs layer 343 and the n-type InP layer 344 may be formed on the InP substrate 330 by the MOCVD method.

Zinc (Zn) may be used as an impurity for forming the p-type InP layer 341 and the p-type Ga(x)InAs layer 342. Silicon (Si) may be used as an impurity for forming the n-type Ga(x)InAs layer 343 and the n-type InP layer 344.

The p-type InP layer 341 is formed as a BSF (Back Surface Field) layer and formed by a material whose band gap is wider than that of the p-type Ga(x)InAs layer 342 and the n-type Ga(x)InAs layer 343.

The n-type InP layer 344 is formed as a window layer and formed by a material whose band gap is wider than that of the p-type Ga(x)InAs layer 342 and the n-type Ga(x)InAs layer 343.

The tunnel junction layer 350 is arranged on the light incident side with respect to the GaInNAs cell 340, and includes a $n^+$-type InP layer 351 and a $p^+$-type Al(x)InAs layer 352. The tunnel junction layer 350 may be formed on the GaInNAs cell 340 by the MOCVD method.

Silicon (Si) may be used as an impurity for a $n^+$-type conductivity, and C (carbon) may be used as an impurity for a $p^+$-type conductivity.

The $n^+$-type InP layer 351 and the $p^+$-type Al(x)InAs layer 352 form a thin p-n junction which is doped in high concentration.

The a doping concentration of both the $n^+$-type InP layer 351 and the $p^+$-type Al(x)InAs layer 352 of the tunnel junction layer 350 is higher than that of the GaInPAs cell 360. The tunnel junction layer 350 is formed as a junction layer such that a current flows between a p-type Ga(x)InP(y)As layer 362 of the GaInPAs cell 360 and the n-type Ga(x)InAs layer 343 of the GaInNAs cell 340 (by the tunnel junction).

The GaInPAs cell 360 includes a p-type InP layer 361, a p-type Ga(x)InP(y)As layer 362, an n-type Ga(x)InP(y)As layer 363, and an n-type [Al(x)Ga](y)InAs layer 364. These four layers are laminated successively on the tunnel junction layer 350 in that order. The band gap of the GaInPAs cell 360 is 1.0 eV.

The p-type InP layer 361, the p-type Ga(x)InP(y)As layer 362, the n-type Ga(x)InP(y)As layer 363, and the n-type [Al(x)Ga](y)InAs layer 364 may be formed by the MOCVD method.

Zinc (Zn) may be used as an impurity for forming the p-type InP layer 361 and the p-type Ga(x)InP(y)As layer 362. Silicon (Si) may be used as an impurity for forming the n-type Ga(x)InP(y)As layer 363 and the n-type [Al(x)Ga](y)InAs layer 364.

The tunnel junction layer 370 is arranged on the light incident side with respect to the GaInPAs cell 360, and includes a $n^+$-type InP layer 371 and a $p^+$-type Al(x)InAs layer 372. The tunnel junction layer 370 may be formed on the GaInPAs cell 360 by the MOCVD method.

Silicon (Si) may be used as an impurity for a $n^+$-type conductivity, and C (carbon) may be used as an impurity for a $p^+$-type conductivity.

The $n^+$-type InP layer 371 and the $p^+$-type Al(x)InAs layer 372 form a thin p-n junction which is doped in high concentration.

The doping concentration of both the $n^+$-type InP layer 371 and the $p^+$-type Al(x)InAs layer 372 of the tunnel junction layer 370 is higher than that of the InP cell 380. The tunnel junction layer 370 is formed as a junction layer such that a current flows between a p-type InP layer 382 of the InP cell 380 and the n-type Ga(x)InP(y)As layer 363 of the GaInPAs cell 360 (by the tunnel junction).

The InP cell 380 is arranged on the light incident side with respect to the tunnel junction layer 370, and includes a p-type [Al(x)Ga](y)InAs layer 381, a p-type InP layer 382, an n-type InP layer 383, an n-type [Al(x)Ga](y)InAs layer 384 and an n-type Ga(x)InP layer 385.

These five layers are laminated successively on the tunnel junction layer 370 in that order. The band gap of the InP cell 380 is 1.35 eV.

The p-type [Al(x)Ga](y)InAs layer 381, the p-type InP layer 382, the n-type InP layer 383, the n-type [Al(x)Ga](y)InAs layer 384 and the n-type Ga(x)InP layer 385 may be formed by the MOCVD method.

Zinc (Zn) may be used as an impurity for forming the p-type [Al(x)Ga](y)InAs layer 381 and the p-type InP layer 382. Silicon (Si) may be used as an impurity for forming the n-type InP layer 383, the n-type [Al(x)Ga](y)InAs layer 384 and the n-type Ga(x)InP layer 385.

The p-type [Al(x)Ga](y)InAs layer 381 is formed as a BSF (Back Surface Field) layer and formed by a material whose band gap is wider than that of the p-type InP layer 382 and the n-type InP layer 383.

The n-type [Al(x)Ga](y)InAs layer 384 is formed as a window layer and formed by a material whose band gap is wider than that of the p-type InP layer 382 and the n-type InP layer 383.

The n-type Ga(x)InP layer 385 is arranged on the light incident side with respect to the n-type [Al(x)Ga](y)InAs layer 384, and is a thin GaInP surface layer having a tensile strain. A thickness of the GaInP surface layer is equal to or less than a critical film thickness where lattice relaxation occurs.

The contact layer 390A is made of a $n^+$-type Ga(x)InAs layer. Mainly, the contact layer 390A is a layer which is laminated on the InP cell 380 so as to form an ohmic contact with the electrode 50. The Ga(x)InAs layer except a part under the electrode 50 may be removed by etching to absorb light before the light is absorbed by the InP cell 380.

The concentrator photovoltaic cell module of the third embodiment has characteristics similar to a multi-junction photovoltaic cell which uses four cells connected in series whose band gaps are 1.8 eV/1.35 eV/1.0 eV/0.75 eV, basically.

The photoelectric conversion cell 320 of the third embodiment is 3-junction type photovoltaic cell, and the photoelectric conversion cell 120 of the first embodiment and the photoelectric conversion cell 220 of the second embodiment are 2-junction type photovoltaic cells. Thus, the conversion efficiency of the third embodiment may be improved in comparison with the first and second embodiment.

As mentioned above, the third embodiment provides the concentrator photovoltaic cell module for preventing limitation of the conversion efficiency caused by the cells for short wavelength range light and for improving the conversion efficiency.

An electric power of the photoelectric conversion cell 110, which absorbs the short wavelength light whose spectrum is easily fluctuates according to the time range and fluctuations of the seasons or weather conditions or the like, is recovered independently of the photoelectric conversion cell 320.

Thus, even if the conversion efficiency of the photoelectric conversion cell 110 whose band gap is 1.8 eV decreases due to scattering of the short wavelength light or the like, the conversion efficiencies of the InP cell 380 whose band gap is 1.35 eV, the GaInPAs cell 360 whose band gap is 1.0 eV and the GaInNAs cell 340 whose band gap is 0.75 eV are not affected.

As mentioned above, the concentrator photovoltaic cell module of the third embodiment may reduce the fluctuation of electric power generation amount with respect to the fluctuation of the spectrum in comparison with the related art, and may have high power electric generation efficiency.

The photoelectric conversion cell 320 including the sub-cell made of the compound semiconductor material may be miniaturized by guiding light condensed by the condenser lens 102 to the photoelectric conversion cell 320. Thus, the cost of the concentrator photovoltaic cell module may be reduced.

The Fourth Embodiment

According to a concentrator photovoltaic cell module of the fourth embodiment, the photoelectric conversion cell 120 of the concentrator photovoltaic cell module 100 of the first embodiment is changed. Other structures of the fourth embodiment are similar to the first embodiment. Thus, same reference signs are used for the other structures and a description of the other structures is appropriately omitted.

Figure 9:
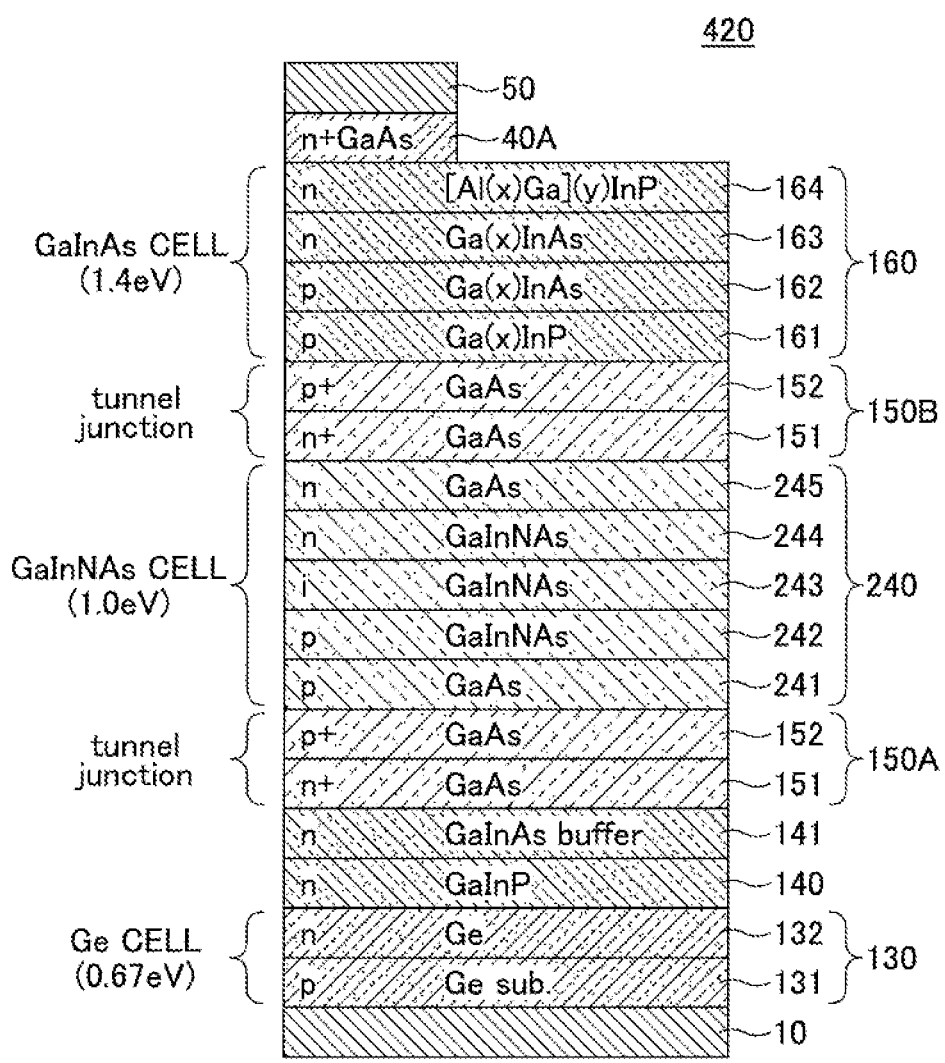
FIG. 9 is a drawing illustrating a cross-sectional structure of a photoelectric conversion cell of the concentrator photovoltaic cell module of a fourth embodiment.

FIG. 9 is a drawing illustrating a cross-sectional structure of a photoelectric conversion cell 420 of the concentrator photovoltaic cell module of the fourth embodiment. The photoelectric conversion cell 420 is used instead of the photoelectric conversion cell 120 illustrated in FIG. 3B.

The photoelectric conversion cell 420 includes an electrode 10, a Ge cell 130, a tunnel junction layer 150A, a GaInNAs cell 240, a tunnel junction layer 150B, a GaInAs cell 160, a contact layer 40A and an electrode 50.

The photoelectric conversion cell 420 includes three sub-cells, which are the GaInAs cell 160 (1.40 eV), the GaInNAs cell 240 (1.0 eV), and the Ge cell 130 (0.67 eV) sequentially from the light incident side to the light emitting side.

The structures of the GaInAs cell 160 and the Ge cell 130 are equal to the structures contained in the photoelectric conversion cell 120 according to the first embodiment. The structure of the GaInNAs cell 240 is equal to the structure contained in the photoelectric conversion cell 220 according to the second embodiment. Thus, in the following, descriptions of the GaInAs cell 160, the Ge cell 130 and the GaInNAs cell 240 are appropriately omitted.

Both the GaInAs cell 160 and the GaInNAs cell 240 are GaAs group sub-cells. The GaAs group sub-cell is a sub-cell made of a material group which may form a crystal growth on a GaAs substrate or a Ge substrate. The material group lattice matches with GaAs or Ge whose lattice constant is close to that of the GaAs. In the following, a material, which may lattice match with GaAs or Ge whose lattice constant is close to that of the GaAs and which may form a crystal growth on a GaAs substrate or a Ge substrate, is referred to as a GaAs lattice matching group material. In the following, a sub-cell formed of the GaAs lattice matching group material is referred to as a GaAs lattice matching group material sub-cell.

In the following, when the Ge substrate 131 is used as the substrate, a sub-cell made of a compound semiconductor, a thickness of which is equal to or less than a critical film thickness and which lattice matches with the Ge, is referred to as the Ge lattice matching group material sub-cell.

The structures of the tunnel junction layer 150A and the tunnel junction layer 150B are equal to the structure of the tunnel junction layer 150 contained in the photoelectric conversion cell 120 according to the first embodiment. The band gap of the tunnel junction layer 150A and the tunnel junction layer 150B are 1.42 eV.

As for the tunnel junction layer 150A and the tunnel junction layer 150B, a tunnel junction layer, in which a p$^+$-type AlGaAs layer and a n$^+$-type GaInP layer are connected, may be used.

The concentrator photovoltaic cell module of the fourth embodiment has characteristics similar to a multi-junction photovoltaic cell which uses four cells connected in series whose band gaps are 1.8 eV/1.4 eV/1.0 eV/0.67 eV, basically.

The photoelectric conversion cell 420 of the fourth embodiment is a 3-junction type photovoltaic cell, and the photoelectric conversion cell 120 of the first embodiment and the photoelectric conversion cell 220 of the second embodiment are 2-junction type photovoltaic cells. Thus, the conversion efficiency of the third embodiment may be improved in comparison with the first and second embodiment.

As mentioned above, the fourth embodiment may prevent limitation of the conversion efficiency caused by the cells for short wavelength range light and improve the conversion efficiency.

An electric power of the photoelectric conversion cell 110, which absorbs the short wavelength light whose spectrum is easily fluctuates according to the time range and fluctuations of the seasons or weather conditions or the like, is recovered independently of the photoelectric conversion cell 420.

Thus, even if the conversion efficiency of the photoelectric conversion cell 110 whose band gap is 1.8 eV decreases due to scattering of the short wavelength light or the like, conversion efficiencies of the GaInAs cell 160 whose band gap is 1.4 eV, the GaInNAs cell 240 whose band gap is 1.0 eV and the Ge cell 130 whose band gap is 0.67 eV are not affected.

As mentioned above, the concentrator photovoltaic cell module, which may reduce the fluctuation of power generation amount with respect to the fluctuation of the spectrum in comparison with the related art, and which may have high power generation efficiency, may be provided.

The photoelectric conversion cell 420 including the sub-cell made of compound semiconductor material may be miniaturized by guiding light condensed by the condenser lens 102 to the photoelectric conversion cell 420. Thus, the cost of the concentrator photovoltaic cell module may be reduced.

The Fifth Embodiment

According to a concentrator photovoltaic cell module of the fifth embodiment, the photoelectric conversion cell 120 of the concentrator photovoltaic cell module 100 of the first embodiment is changed. Other structures of the fifth embodiment are similar to the first embodiment. Thus, same reference signs are used for the other structures and a description of the other structures is appropriately omitted.

Figure 10:
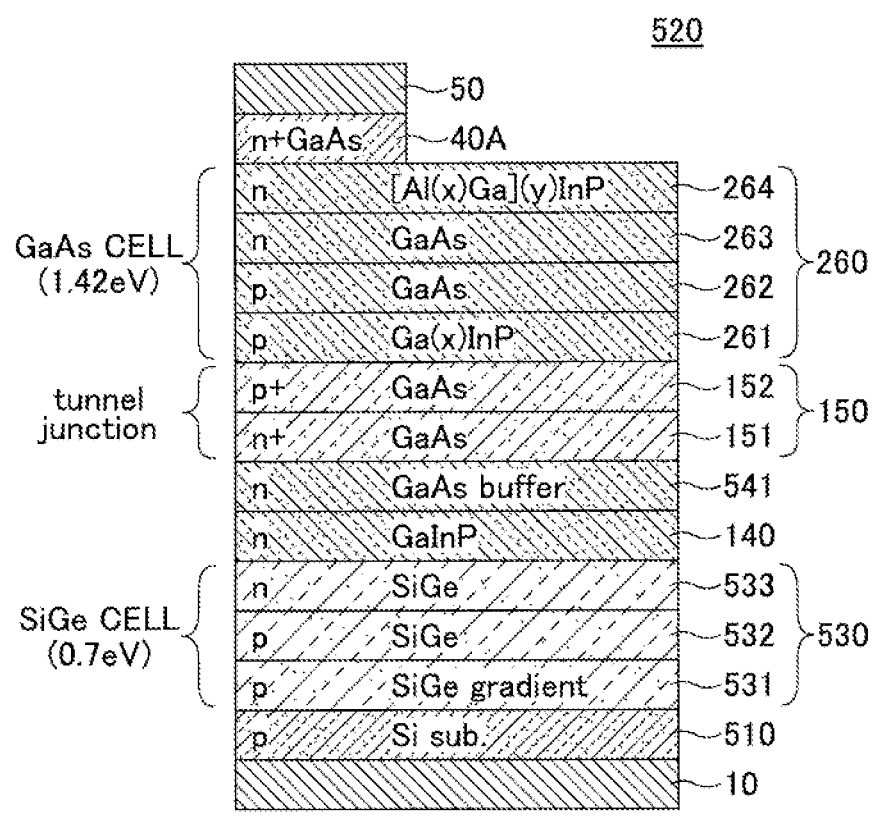
FIG. 10 is a drawing illustrating a cross-sectional structure of a photoelectric conversion cell of the concentrator photovoltaic cell module of a fifth embodiment.

FIG. 10 is a drawing illustrating a cross-sectional structure of a photoelectric conversion cell 520 of the concentrator photovoltaic cell module of the fifth embodiment. The photoelectric conversion cell 520 is used instead of photoelectric conversion cell 120 illustrated in FIG. 3B.

The photoelectric conversion cell 520 includes an electrode 10, a p-type Si substrate 510, a SiGe cell 530, an n-type GaInP layer 140, an n-type GaAs buffer layer 541, a tunnel junction layer 150, a GaInAs cell 260, a contact layer 40A and an electrode 50.

The SiGe cell 530 is a sub-cell made of a semiconductor material which does not lattice match with Si. The GaAs cell 260 is a sub-cell made of a semiconductor material which does not lattice match with Si.

The sub-cell made of the semiconductor material which does not lattice match with Si or the sub-cell made of the semiconductor material which does not lattice match with Si is a sub-cell which may be laminated on the Si substrate via a layer which adjusts a lattice constant like a composition gradient layer. For example, it may be a sub-cell made of the compound semiconductor material whose lattice constant is between the lattice constant of the GaAs group, the lattice constant of GaAs and the lattice constant of InP, or a sub-cell made of the compound semiconductor material whose lattice constant is between the lattice constant of Si and the lattice constant of Ge.

The SiGe cell 530 is laminated on the p-type substrate 510.

The SiGe cell 530 is a semiconductor cell (a photovoltaic cell) which includes a p-type SiGe compositionally gradient layer 531, a p-type SiGe layer 532 and an n-type SiGe layer 533. These three layers are laminated successively on the Si substrate 510 in that order. The band gap of the SiGe cell 530 is 0.7 eV.

The p-type SiGe compositionally gradient layer 531, the p-type SiGe layer 532 and the n-type SiGe layer 533 may be formed by the MOCVD method.

Boron (B) may be used as an impurity for forming the p-type SiGe compositionally gradient layer 531. Boron (B) may be used as an impurity for forming the p-type SiGe layer 532. Phosphorus (P) may be used as an impurity for forming the n-type SiGe layer 533.

The p-type SiGe compositionally gradient layer 531 is a layer having a gradient of a composition. Between the p-type Si substrate 510 and the p-type SiGe layer 532 and between the p-type Si substrate 510 and the n-type SiGe layer 533, a percentage of the Si decreases and a percentage of Ge increases from the p-type Si substrate 510 side (lower side) to the p-type SiGe layer 532 side (upper side).

Such the p-type SiGe compositionally gradient layer 531 may be formed by adjusting the composition of Si and Ge successively with Boron (B) as an impurity, when forming the layer by the MOOCVD method.

The n-type GaInP layer 140 is formed on the SiGe cell 530 as a first layer. When the n-type GaInP layer 140 is formed, the n-type SiGe layer 533 is formed on the p-type SiGe layer 532 by phosphorus (P) contained in the n-type GaInP layer 140 diffusing in an upper layer portion of the p-type SiGe layer 532. The n-type GaInP layer 140 is formed for forming the n-type SiGe layer 533 by diffusing phosphorus (P) on the p-type SiGe layer 532.

According to the fifth embodiment, the p-type SiGe layer 532 and the n-type SiGe layer 533, which lattice match with GaAs, are formed on the p-type Si substrate 510. In order to match the lattice constant, about 2 percent of Si is added to the p-type SiGe layer 532 and the n-type SiGe layer 533.

A composition ratio of Si to Ge in the p-type SiGe compositionally gradient layer 531 is adjusted such that a percentage of Ge gradually increases from the p-type Si substrate 510 side to the p-type SiGe layer 532 side. Finally, the percentage of Ge becomes 98 percent. This corresponds with the percentage of Si (2 percent) in the p-type SiGe layer 532 and the n-type SiGe layer 533.

Thermal expansion coefficients ($10^{-6}K^{-1}$) of Si and GaAS are 2.4 and 6.0 respectively, and a difference of the thermal expansion coefficient is large. The thermal expansion coefficient of Ge is 5.5, and is close to the thermal expansion coefficient of GaAS. The p-type SiGe compositionally gradient layer 531 relaxes (reduce) the difference of the thermal expansion coefficient, resulting in a preferable compound semiconductor being formed. Although the SiGe cell 530, whose lattice constant is equal to GaAs, is used in the fifth embodiment, note that a composition, whose lattice constant is between the lattice constant of Si and the lattice constant of Ge, may be used. Further, the sub-cell of the photoelectric conversion cell 520 may be formed at least one of the semiconductor material which does not lattice match with Si and the compound semiconductor material which does not lattice match with Si.

The concentrator photovoltaic cell module of the fifth embodiment has characteristics similar to a multi-junction photovoltaic cell which uses three cells connected in series whose band gaps are 1.8 eV/1.42 eV/0.7 eV, basically.

As mentioned above, the fifth embodiment may prevent limitation of the conversion efficiency caused by the cells for short wavelength range light and improve the conversion efficiency.

An electric power of the photoelectric conversion cell 110, which absorbs the short wavelength light whose spectrum is easily fluctuates according to the time range and fluctuations of the seasons or weather conditions or the like, is recovered independently of the photoelectric conversion cell 520.

Thus, even if the conversion efficiency of the photoelectric conversion cell 110 whose band gap is 1.8 eV decreases due to scattering of the short wavelength light or the like, conversion efficiencies of the GaAs cell 260 whose band gap is 1.42 eV and the SiGe cell 530 whose band gap is 0.7 eV are not affected.

As mentioned above, the concentrator photovoltaic cell module, which may reduce the fluctuation of power generation amount with respect to the fluctuation of the spectrum in comparison with the related art, and which may have high power generation efficiency, may be provided.

The photoelectric conversion cell 520 including the sub-cell made of compound semiconductor material may be miniaturized by guiding light condensed by the condenser lens 102 to the photoelectric conversion cell 520. Thus, the cost of the concentrator photovoltaic cell module may be reduced.

Further, the present invention is not limited to these embodiments, but various variations and modifications may be made without departing from the scope of the present invention.

The present application is based on Japanese priority application No. 2014-237380 filed on Nov. 25, 2014, with the Japanese Patent Office, the entire contents of which are hereby incorporated by reference.

What is claimed is:

1. A concentrator photovoltaic cell comprising:
    a light condenser element configured to condense light in a light incident direction;
    a first photoelectric conversion cell disposed on a light incident surface of the light condenser element, a light emitting surface of the light condenser element or further downstream, in the light incident direction, from the light condenser element in a light incident path, and configured to perform a photoelectric conversion, the first photoelectric conversion cell having a first band gap;

a second photoelectric conversion cell configured to perform a photoelectric conversion of light incident on a light incident surface of the second photoelectric conversion cell, the second photoelectric conversion cell being separated from the first photoelectric conversion cell by a predetermined empty space and being disposed further downstream, in the light incident direction, from the first photoelectric conversion cell in the light incident path, and the second photoelectric conversion cell including plural sub-cells disposed one on another in the light incident direction, the plural sub-cells of the second photoelectric conversion cell having respective band gaps decreasing from an upstream side towards a downstream side, in the light incident direction, and said respective band gaps of the plural sub-cells of the second photoelectric conversion cell each being smaller than the first band gap of the first photoelectric conversion cell, the light condensed by the light condenser element being incident on the second photoelectric conversion cell;

a first output circuit configured to output a first output current which is output by the first photoelectric conversion cell; and a second output circuit differing from the first output circuit and configured to output a second output current which is output by the second photoelectric conversion cell.

2. The concentrator photovoltaic cell as claimed in claim 1, wherein the first output circuit and the second output circuit are connected to an electric power converter in parallel, the electric power converter being configured to convert DC power to AC power.

3. The concentrator photovoltaic cell as claimed in claim 1, wherein the first output circuit is connected to the second output circuit via a boosting circuit.

4. The concentrator photovoltaic cell as claimed in claim 1, wherein the first photoelectric conversion cell is a semiconductor cell made of a semiconductor material.

5. The concentrator photovoltaic cell as claimed in claim 4, wherein the semiconductor cell is an amorphous silicon cell.

6. The concentrator photovoltaic cell as claimed in claim 1, wherein the second photoelectric conversion cell further includes a substrate, and the plurality of sub-cells are disposed on a light incident side with respect to the substrate and are laminated on the substrate.

7. The concentrator photovoltaic cell as claimed in claim 6, wherein the substrate is a GaAs substrate or a Ge substrate, and wherein the plurality of sub-cells are GaAs group sub-cells.

8. The concentrator photovoltaic cell as claimed in claim 6, wherein the substrate is an InP substrate, and wherein the plurality of sub-cells are InP group sub-cells.

9. The concentrator photovoltaic cell as claimed in claim 6, wherein the substrate is a Si substrate, and wherein the plurality of sub-cells include at least one of a semiconductor material which does not lattice match with the Si substrate and a compound semiconductor material which does not lattice match with the Si substrate.

10. The concentrator photovoltaic cell as claimed in claim 1, wherein the light condenser element is a condenser lens or a condenser mirror.

11. The concentrator photovoltaic cell as claimed in claim 1, wherein the second photoelectric conversion cell overlaps with the first photoelectric conversion cell in a plan view.

12. The concentrator photovoltaic cell as claimed in claim 1, further comprising:

a radiator element configured to radiate heat generated from the second photoelectric conversion cell, wherein a size of the radiator element is smaller than the size of the first photoelectric conversion cell in a plan view and the size of the radiator element is larger than the size of the second photoelectric conversion cell in the plan view.

13. The concentrator photovoltaic cell as claimed in claim 1, wherein a size of the second photoelectric cell is smaller than a size of the first photoelectric conversion cell in a plan view.

14. A concentrator photovoltaic cell comprising:

a plurality of light condenser elements each configured to condense light in a light incident direction;

a plurality of first photoelectric conversion cells corresponding to the plurality of respective light condenser elements and configured to perform photoelectric conversions, each first photoelectric conversion cell, amongst the plurality of first photoelectric conversion cells, being disposed on a light incident surface of the corresponding light condenser element, a light emitting surface of the light condenser element or further downstream, in the light incident direction, from the light condenser element in a light incident path, each of the plurality of the first photoelectric conversion cells having a first band gap;

a plurality of second photoelectric conversion cells corresponding to the plurality of respective first photoelectric conversion cells, each second photoelectric conversion cell, amongst the plurality of second photoelectric conversions cells, being configured to perform a photoelectric conversion of light incident on a light incident surface of the second photoelectric conversion cell, each second photoelectric conversion cell being separated from a corresponding first photoelectric conversion cell by a predetermined empty space and being disposed further downstream, in the light incident direction, from the corresponding first photoelectric conversion cell in the light incident path, the second photoelectric conversion cell including plural sub-cells disposed one on another in the light incident direction, the plural sub-cells of the second photoelectric conversion cell having respective band gaps decreasing from an upstream side towards a downstream side, in the light incident direction, and said respective band gaps of the plural sub-cells of the second photoelectric conversion cell each being smaller than the first band gap of the first photoelectric conversion cell, light condensed by the plurality of light condenser elements being incident on the plurality of second photoelectric conversion cell, respectively;

a first output circuit configured to output a first output current which is output by the plurality of first photoelectric conversion cells; and a second output circuit differing from the first output circuit and configured to output a second output current which is output by the plurality of second photoelectric conversion cells.

15. The concentrator photovoltaic cell as claimed in claim 14, wherein the first output circuit is a configuration in which the plurality of the first photoelectric conversion cells are connected in series, and wherein the second output circuit is a configuration in which the plurality of the second photoelectric conversion cells are connected in series.

16. The concentrator photovoltaic cell as claimed in claim 1, wherein the light incident surface of the light condenser element is convex-shaped.

17. The concentrator photovoltaic cell as claimed in claim 1, wherein the light condenser element includes a Fresnel lens.

18. The concentrator photovoltaic cell as claimed in claim 1, wherein the first photoelectric conversion cell is disposed on the light incident surface of the light condenser element.

19. The concentrator photovoltaic cell as claimed in claim 1, wherein the first photoelectric conversion cell is disposed on the light emitting surface of the light condenser element.

20. The concentrator photovoltaic cell as claimed in claim 1, wherein the first photoelectric conversion cell is electrically isolated from the second photoelectric conversion cell that includes the plural sub-cells that are disposed one on another in the light incident direction and have the respective band gaps decreasing from the upstream side towards the downstream side.

* * * * *